United States Patent
Song et al.

(10) Patent No.: US 9,508,589 B2
(45) Date of Patent: Nov. 29, 2016

(54) CONDUCTIVE LAYER ROUTING

(71) Applicant: QUALCOMM Incorporated, San Diego, CA (US)

(72) Inventors: Stanley Seungchul Song, San Diego, CA (US); Kern Rim, San Diego, CA (US); Zhongze Wang, San Diego, CA (US); Jeffrey Junhao Xu, San Diego, CA (US); Xiangdong Chen, Irvine, CA (US); Choh Fei Yeap, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 0 days.

(21) Appl. No.: 14/283,162

(22) Filed: May 20, 2014

(65) Prior Publication Data
US 2015/0194339 A1    Jul. 9, 2015

Related U.S. Application Data

(60) Provisional application No. 61/923,482, filed on Jan. 3, 2014.

(51) Int. Cl.
*H01L 21/768*     (2006.01)
*H01L 23/48*      (2006.01)

(52) U.S. Cl.
CPC ... *H01L 21/76802* (2013.01); *H01L 21/76814* (2013.01); *H01L 21/76877* (2013.01); *H01L 21/76895* (2013.01); *H01L 23/48* (2013.01); *H01L 2924/0002* (2013.01)

(58) Field of Classification Search
USPC .......................... 257/770, 741, 773; 438/618
IPC .... H01L 21/76814,21/76877, 23/48, 21/76895, H01L 21/76802, 2924/0002, 2924/00
See application file for complete search history.

(56) References Cited

U.S. PATENT DOCUMENTS

| | | |
|---|---|---|
| 6,174,803 B1 | 1/2001 | Harvey |
| 7,791,109 B2 | 9/2010 | Wann et al. |
| 8,124,525 B1 | 2/2012 | Koburger, III et al. |
| 2008/0191283 A1 | 8/2008 | Shin |
| 2010/0117048 A1 | 5/2010 | Lung et al. |
| 2012/0211837 A1 | 8/2012 | Baars et al. |
| 2013/0175583 A1 | 7/2013 | Yuan et al. |

OTHER PUBLICATIONS

International Search Report and Written Opinion—PCT/US2014/065529—ISA/EPO—Mar. 10, 2015.

*Primary Examiner* — Hrayr A Sayadian
(74) *Attorney, Agent, or Firm* — Seyfarth Shaw LLP

(57) ABSTRACT

Methods of fabricating middle of line (MOL) layers and devices including MOL layers. A method in accordance with an aspect of the present disclosure includes depositing a hard mask across active contacts to terminals of semiconductor devices of a semiconductor substrate. Such a method also includes patterning the hard mask to selectively expose some of the active contacts and selectively insulate some of the active contacts. The method also includes depositing a conductive material on the patterned hard mask and the exposed active contacts to couple the exposed active contacts to each other over an active area of the semiconductor devices.

16 Claims, 13 Drawing Sheets

CONDUCTIVE LAYER ROUTING

CROSS-REFERENCE TO RELATED APPLICATION

This application claims the benefit under 35 U.S.C. §119 (e) to U.S. Provisional Patent Application No. 61/923,482 entitled "CONDUCTIVE LAYER ROUTING," filed on Jan. 3, 2014, the disclosure of which is expressly incorporated by reference herein in its entirety.

BACKGROUND

Field

Aspects of the present disclosure relate to semiconductor devices, and more particularly to routing conductive layers, such as the middle of line layers, within an integrated circuit.

Background

Interconnect layers are often used to connect different devices together on an integrated circuit device. Because of the increased density of circuits, the number of conductive layers has increased, and the routing of such conductive layers has become more complex. Further, coupling particular contacts on a circuit without electrically connecting other contacts in between the specified connections may involve large areas and make power access to certain parts of the circuit difficult. Routing interconnect layers around such structures may involve additional area to prevent the interconnect layers from electrically connecting undesired contacts. Routing interconnect layers around undesired contacts may involve additional vias between the interconnect layers. The additional vias between the interconnect layers may increases the complexity and cost of fabrication. Moreover, additional vias between the interconnect layers may increase the failure modes of the circuit.

SUMMARY

A method of fabricating middle of line (MOL) layers may include depositing a hard mask across active contacts to terminals of semiconductor devices of a semiconductor substrate. Such a method also includes patterning the hard mask to selectively expose some of the active contacts and selectively insulate some of the active contacts. The method also includes depositing a conductive material on the patterned hard mask and the exposed active contacts to couple the exposed active contacts to each other over an active area of the semiconductor devices.

A device including middle-of-line (MOL) layers may include a mask layer that selectively exposes some active contacts to terminals of semiconductor devices of a semiconductor substrate and selectively insulates some of the active contacts. The device also includes a conductive material coupled to a patterned hard mask and the exposed active contacts to couple the exposed active contacts to each other over an active area of the semiconductor devices.

A device including middle-of-line (MOL) layers may include means for selectively exposing some active contacts to terminals of semiconductor devices of a semiconductor substrate and for selectively insulating some of the active contacts. The device also includes means for coupling the exposed active contacts to each other.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Semiconductor fabrication processes are often divided into three parts: a front end of line (FEOL), a middle of line (MOL) and a back end of line (BEOL). Front end of line processes include wafer preparation, isolation, well formation, gate patterning, spacers, and dopant implantation. A middle of line process includes gate and terminal contact formation. The gate and terminal contact formation of the middle of line process, however, is an increasingly challenging part of the fabrication flow, particularly for lithography patterning. Back end of line processes include forming interconnects and dielectric layers for coupling to the FEOL devices. These interconnects may be fabricated with a dual damascene process using plasma-enhanced chemical vapor deposition (PECVD) deposited interlayer dielectric (ILD) materials.

More recently, the number of interconnect levels for circuitry has substantially increased due to the large number of transistors that are now interconnected in a modern microprocessor. The increased number of interconnect levels for supporting the increased number of transistors involves more intricate middle of line processes to perform the gate and terminal contact formation.

As described herein, the middle of line interconnect layers may refer to the conductive interconnects for connecting a first conductive layer (e.g., metal 1 (M1)) to the oxide diffusion (OD) layer of an integrated circuit as well for connecting M1 to the active devices of the integrated circuit. The middle of line interconnect layers for connecting M1 to the OD layer of an integrated circuit may be referred to as "MD1" and "MD2." The middle of line interconnect layer for connecting M1 to the poly gates of an integrated circuit may be referred to as "MP."

Routing middle of line interconnect layers around undesired contacts may involve additional vias between the middle of line interconnect layers. The additional vias between the middle of line interconnect layers may increases the complexity and cost of fabrication. Moreover, additional vias between the middle of line interconnect layers may increase the failure modes of the circuit. In one aspect of the present disclosure, a second MOL conductive layer provides a second set of local interconnects (stacked contacts (MD2)) using existing process technology. In this configuration, the second MOL conductive layer interconnects the specified active contacts MD1 using the stacked contacts MD2, without connecting undesired contacts between the specified active contacts MD1.

Figure 1:
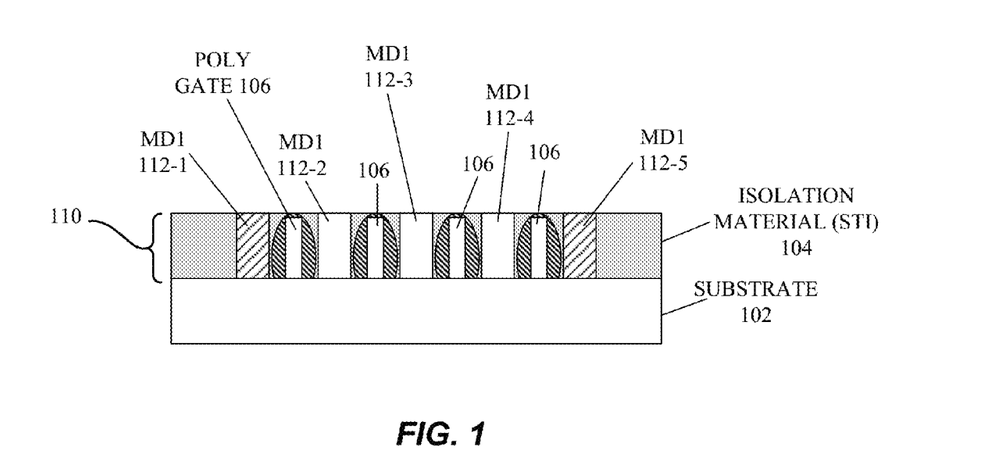
FIG. 1 illustrates a side view of a semiconductor circuit.

FIG. 1 shows a cross-sectional view illustrating an integrated circuit (IC) device 100 in which routing of conductive layers is performed within a middle of line (MOL) interconnect layer 110 according to one aspect of the disclosure. The IC device 100 includes a semiconductor substrate (e.g., a silicon wafer) 102 having shallow trench isolation (STI) regions (e.g., isolation material 104). Within the STI region and the substrate 102 is an active region in which active devices having a source region, a drain region, and a gate region (e.g., poly gate 106) are formed.

Figure 2:
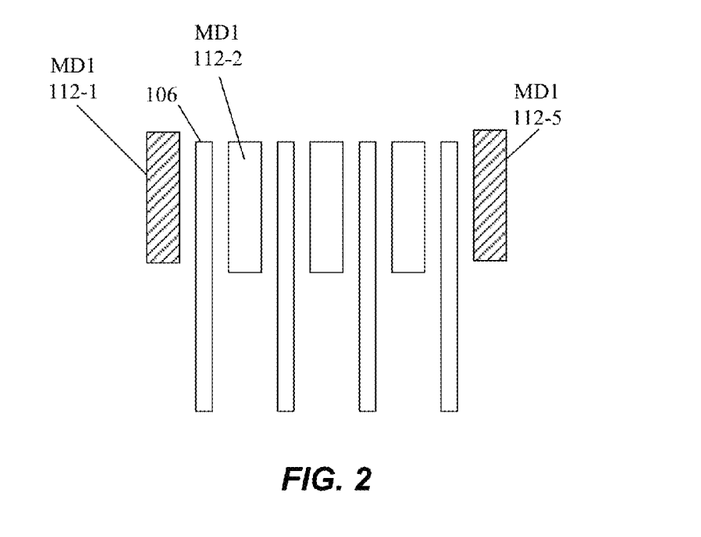
FIG. 2 illustrates a top view of the semiconductor circuit of FIG. 1.

In FIGS. 1 and 2, the first MOL interconnect layer 110 includes a set of active (oxide diffusion (OD)) contacts (MD1) 112 (MD1 112-1, MD1 112-2, MD1 112-3, MD1 112-4, and MD1 112-5) that are fabricated on the substrate 102 using existing process technology. The active contacts 112 may be coupled to the active devices (e.g., the source and drain regions). In this configuration, a routing of the conductive layers may be performed to couple the active contact MD1 112-1 and the active contact MD1 112-5. The first MOL conductive layer may be composed of tungsten or other like conductive material.

Figure 3:
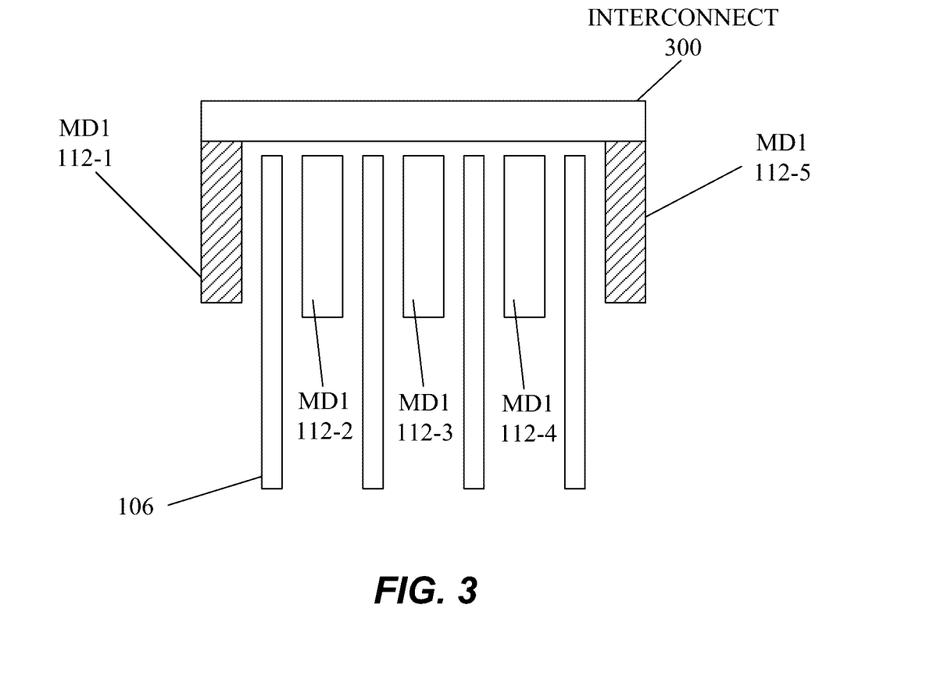
FIGS. 3 and 4 illustrate possible approaches for connection of contacts on a semiconductor circuit.

FIG. 3 illustrates a top view of a first approach for coupling contacts on the substrate 102. An interconnect 300 is shown as coupling the active contact MD1 112-1 and the MD1 active contact 112-5, without electrically coupling to the active contacts MD1 112-2, MD1 112-3 and MD1 112-4, or the poly gates 106. This approach, however, uses a large open area over the isolation material 104 that makes power access to the active contacts 112 (e.g., MD1 112-2 to MD1 112-4) and/or the poly gates 106 difficult.

Figure 4:
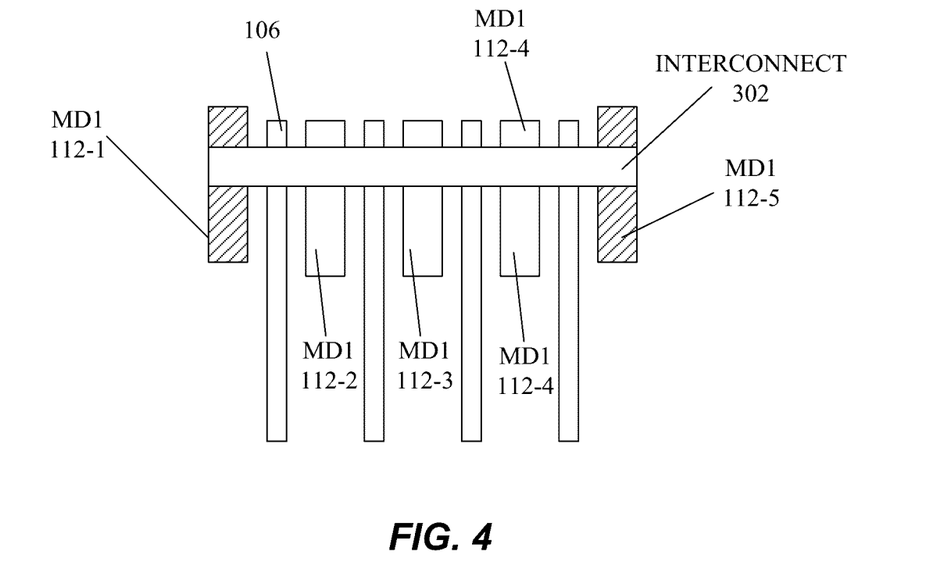

FIG. 4 illustrates a top view of a second approach in coupling contacts on the substrate 102. An interconnect 302 is shown as coupling the active contact MD1 112-1 and the active contact MD1 112-5, across the active contacts MD1 112-2 to MD1 112-4, without electrically coupling to the active contacts MD1 112-2 to MD1 112-4 or the poly gates 106. Although this approach saves cell area, this approach may electrically couple the active contacts MD1 112-1 and MD1 112-5 to the active contacts MD1 112-2, MD1 112-3 and MD1 112-4, and possibly the poly gates 106, which is often undesirable.

FIGS. 5A through 13 illustrate middle of line interconnects in accordance with aspects of the present disclosure. In one configuration, a second MOL conductive layer provides a second set of local interconnects (stacked contacts (MD2)) 120 using existing process technology. In this configuration, the second MOL conductive layer forming the stacked contacts MD2 enables connection of the active contacts MD1 112-1 and MD1 112-5 without connecting undesired contacts (e.g., MD1 112-2 to MD1 112-4) between the specified active contacts MD1 112-1 and MD1 112-5. In this aspect of the disclosure, connection of the active contacts MD1 112-1 and MD1 112-5 using the second MOL conductive layer MD2 is over an active area of the semiconductor devices of the integrated circuit.

Figure 5A:
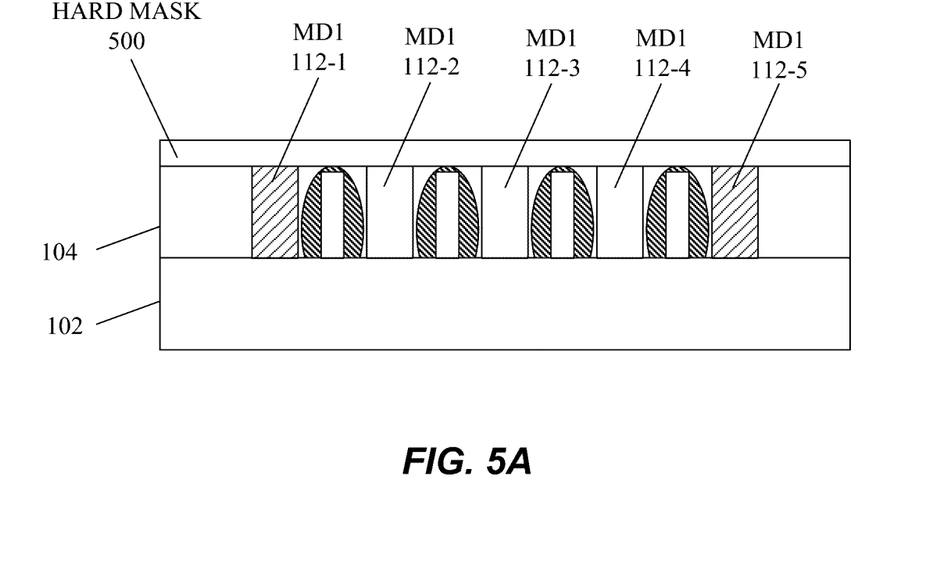
FIGS. 5A and 5B illustrate side and top views, respectively, of an integrated circuit including middle of line interconnects according to an aspect of the present disclosure.
Figure 5B:
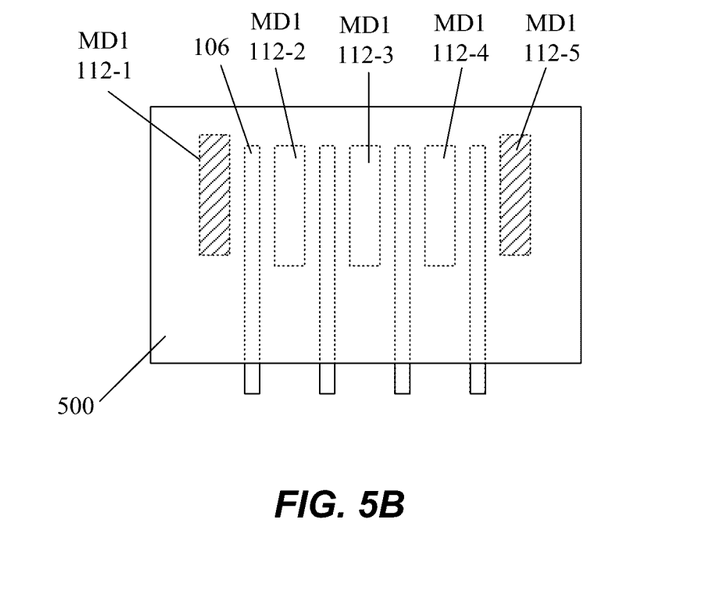

FIGS. 5A and 5B illustrate side and top views, respectively, of an integrated circuit including middle of line interconnects according to an aspect of the present disclosure. In FIG. 5A, a hard mask 500 is coupled to a surface of the integrated circuit opposite to the substrate 102. The hard mask 500 may be a photoresist, an oxide layer, a nitride layer, a thin film, or other like materials or layer of material. FIG. 5B illustrates the top view of the integrated circuit in which the hard mask 500 covers the active contacts 112 and portions of the poly gates 106. The active contacts 112 and covered portions of the poly gates 106 are shown in dashed lines to indicate that the hard mask 500 covers the active contacts 112 and portions of the poly gates 106. The uncovered portions of the poly gates 106 are shown in solid lines.

Figure 6A:
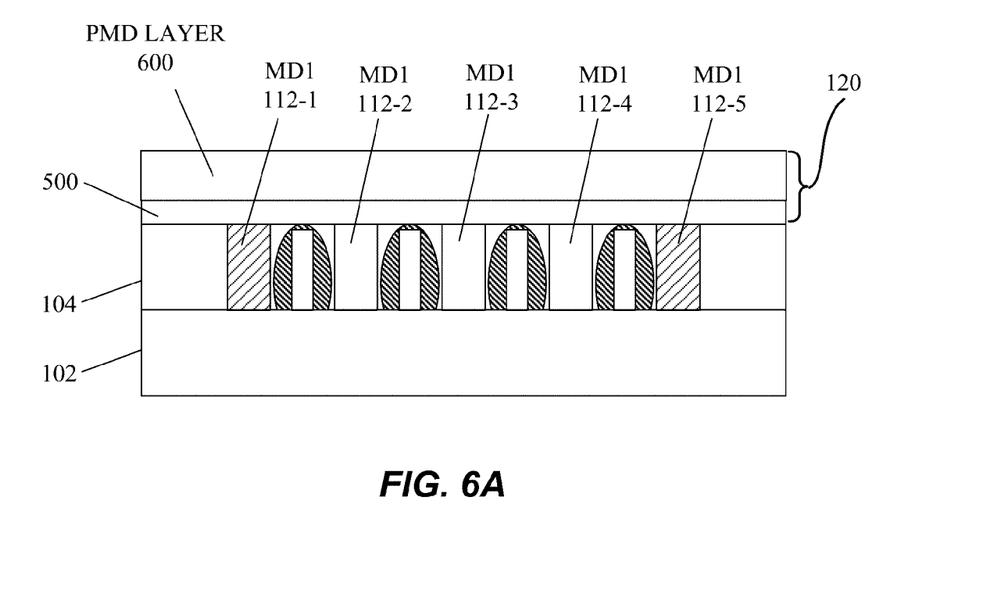
FIGS. 6A and 6B illustrate side and top views, respectively, of the integrated circuit of FIGS. 5A and 5B, including middle of line interconnects according to an aspect of the present disclosure.
Figure 6B:
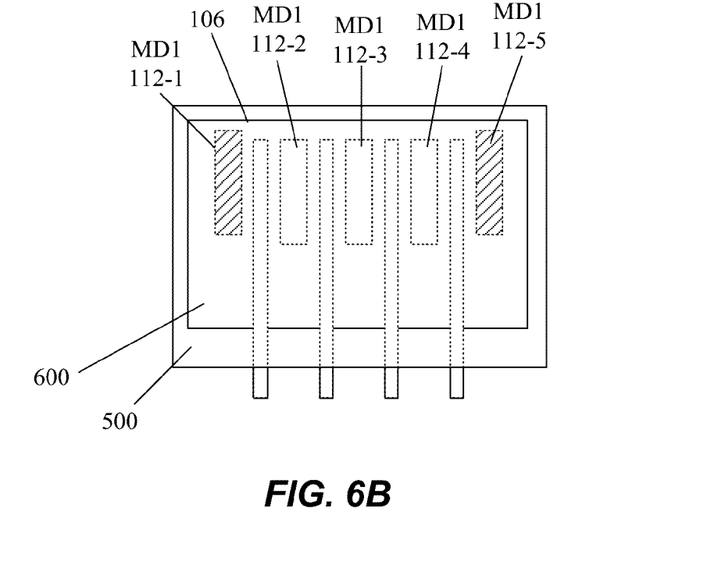

FIGS. 6A and 6B illustrate side and top views, respectively, of the integrated circuit of FIGS. 5A and 5B, including middle of line interconnects according to an aspect of the present disclosure. In FIG. 6A the side view shows a pre-metal dielectric layer 600 (PMD) coupled to the hard mask 500 within the second MOL interconnect layer 120. In FIG. 6B the top view shows that the pre-metal dielectric layer 600 (PMD) covers a portion of the hard mask 500, such that a portion of the poly gates 106 are not covered by pre-metal dielectric layer 600 to enable subsequent exposure of the poly gates 106.

Figure 7A:
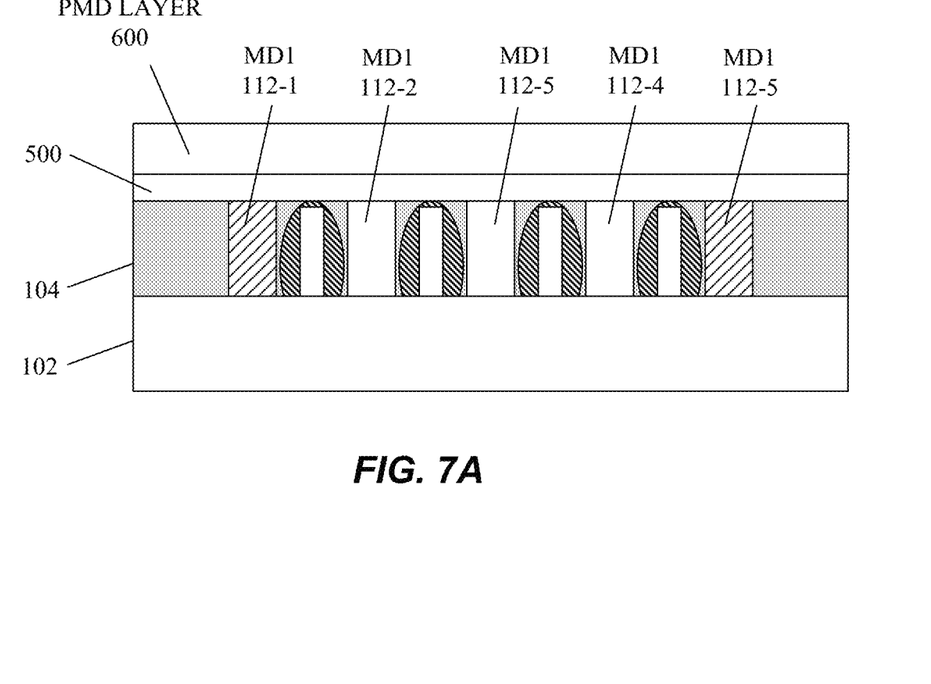
FIGS. 7A and 7B illustrate side and top views, respectively, of the integrated circuit of FIGS. 6A and 6B, including middle of line interconnects according to an aspect of the present disclosure.
Figure 7B:
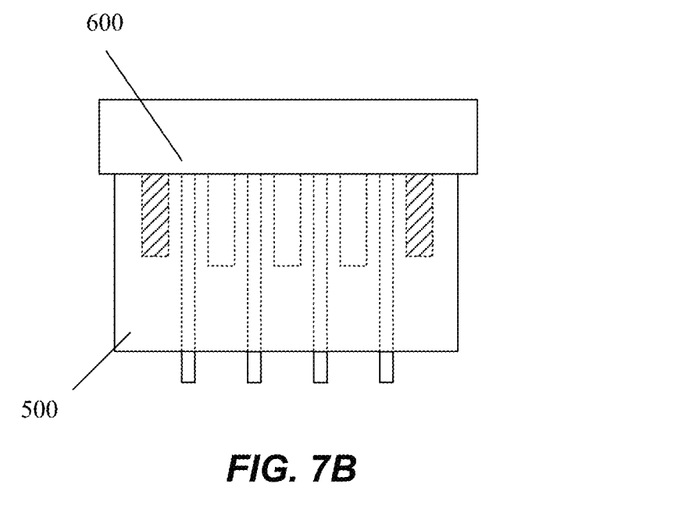

FIGS. 7A and 7B illustrate side and top views, respectively, of the integrated circuit of FIGS. 6A and 6B, including middle of line interconnects according to an aspect of the present disclosure. As best seen in FIG. 7B, the top view shows patterning of the pre-metal dielectric layer 600. The hard mask 500 is selectively exposed through etching of the pre-metal dielectric layer 600.

Figure 8A:
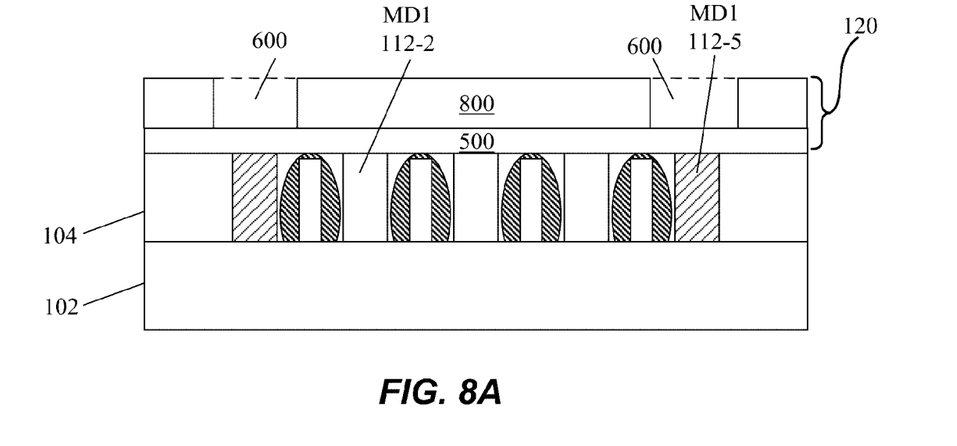
FIGS. 8A and 8B illustrate side and top views, respectively, of the integrated circuit of FIGS. 7A and 7B, including middle of line interconnects according to an aspect of the present disclosure.
Figure 8B:
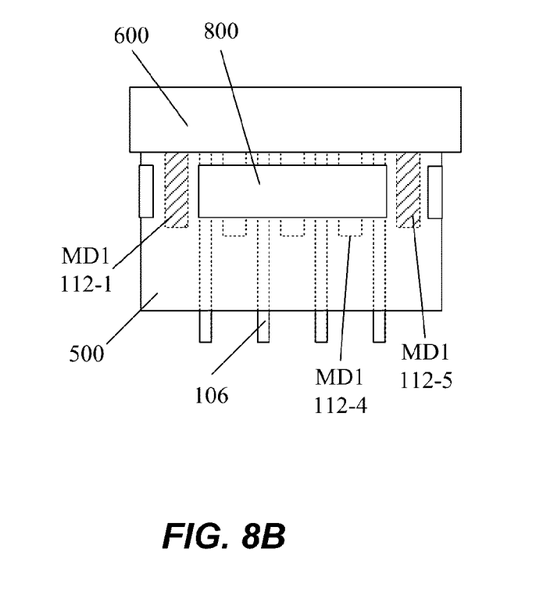

FIGS. 8A and 8B illustrate side and top views, respectively, of the integrated circuit of FIGS. 7A and 7B, including middle of line interconnects according to an aspect of the present disclosure. In FIG. 8A the side view shows patterning of a layer 800 that is coupled to the hard mask 500. The layer 800 may be an insulator or other layer that blocks access to some of the active contacts 112 (e.g., MD1 112-2, MD1 112-3 and MD1 112-4) and/or the poly gates 106 according to the patterning of the layer 800. In this arrangement the non-etched portion of the pre-metal dielectric layer 600 is shown adjacent to the layer 800 in dashed lines, as further illustrated in FIG. 8B.

As shown in the top view of FIG. 8B, the openings are selected to expose the active contacts MD1 112-1 and MD1 112-5, while blocking the active contacts 112 (e.g., MD1 112-2, MD1 112-3 and MD1 112-4) and the poly gates 106. In one configuration, a pattern of the layer 800 may be an MD2 pattern that is rectangular, and the openings of the layer 800 may be square or rectangular in shape. In other configurations, the openings may be other shapes.

Figure 9A:
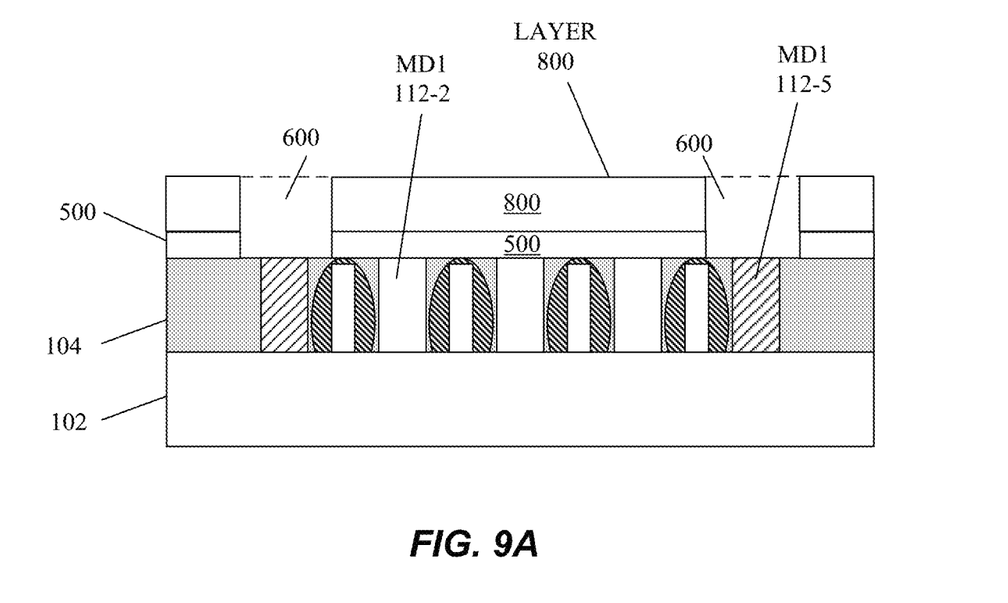
FIGS. 9A and 9B illustrate side and top views, respectively, of the integrated circuit of FIGS. 8A and 8B, including middle of line interconnects according to an aspect of the present disclosure.
Figure 9B:
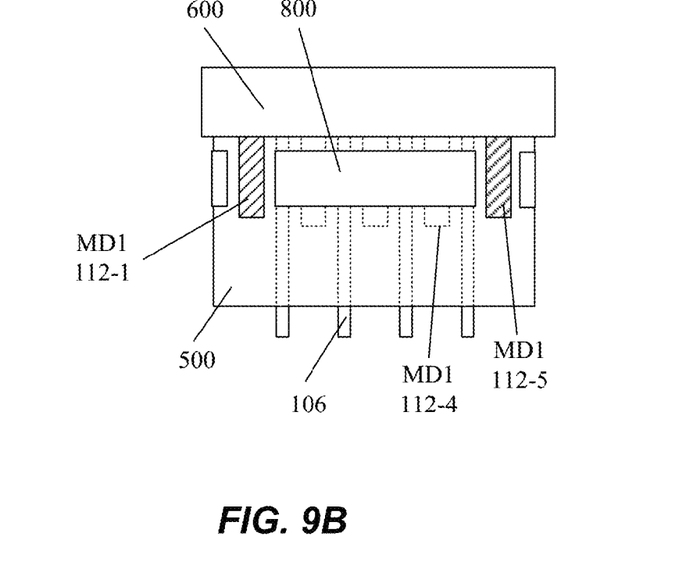

FIGS. 9A and 9B illustrate side and top views, respectively, of the integrated circuit of FIGS. 8A and 8B, including middle of line interconnects according to an aspect of the present disclosure. In FIG. 9A, the side view shows etching of the hard mask 500 using the pattern of the layer 800 to expose the active contacts MD1 112-1 and MD1 112-5. The non-etched pre-metal dielectric layer 600 is shown adjacent to the layer 800 in dashed lines. In FIG. 9B, the top view further illustrates that the active contacts MD1 112-1 and MD1 112-5 are exposed by the etching of the hard mask 500, as shown by the solid lines.

Figure 10A:
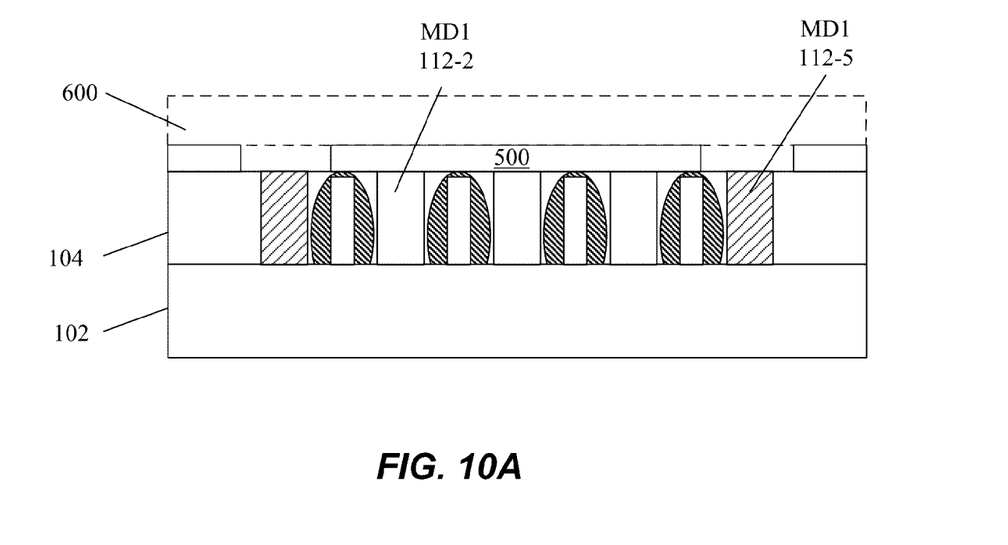
FIGS. 10A and 10B illustrate side and top views, respectively, of the integrated circuit of FIGS. 9A and 9B, including middle of line interconnects according to an aspect of the present disclosure.
Figure 10B:
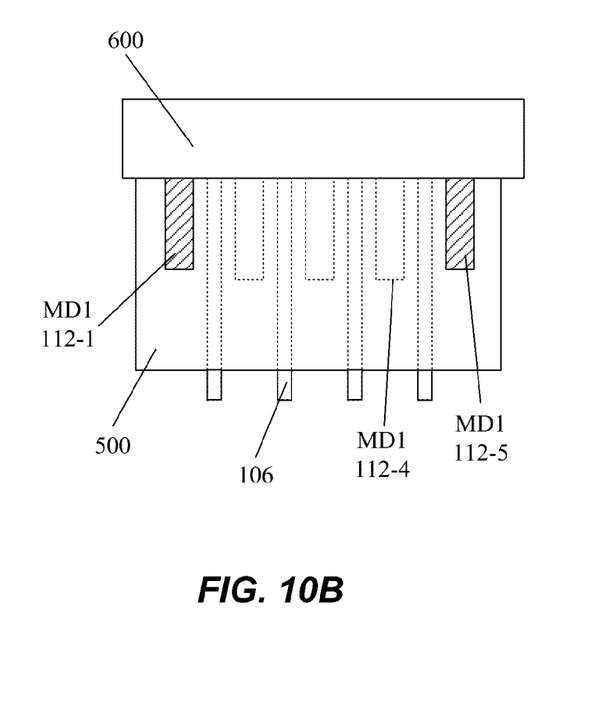

FIGS. 10A and 10B illustrate side and top views, respectively, of the integrated circuit of FIGS. 9A and 9B, including middle of line interconnects according to an aspect of the present disclosure. In FIG. 10A, the side view illustrates removal of the layer 800, with the non-etched portion of the pre-metal dielectric layer 600 shown in dashed lines adjacent to the exposed MD1 112-1 and MD1 112-5. In FIG. 10B, the top view illustrates that the layer 800 is removed from the hard mask 500 over the active contacts MD1 112-2, MD1 112-3 and MD1 112-4 as well as the poly gates 106. The active contacts MD1 112-1 and MD1 112-5 are exposed through openings in the hard mask 500.

Figure 11A:
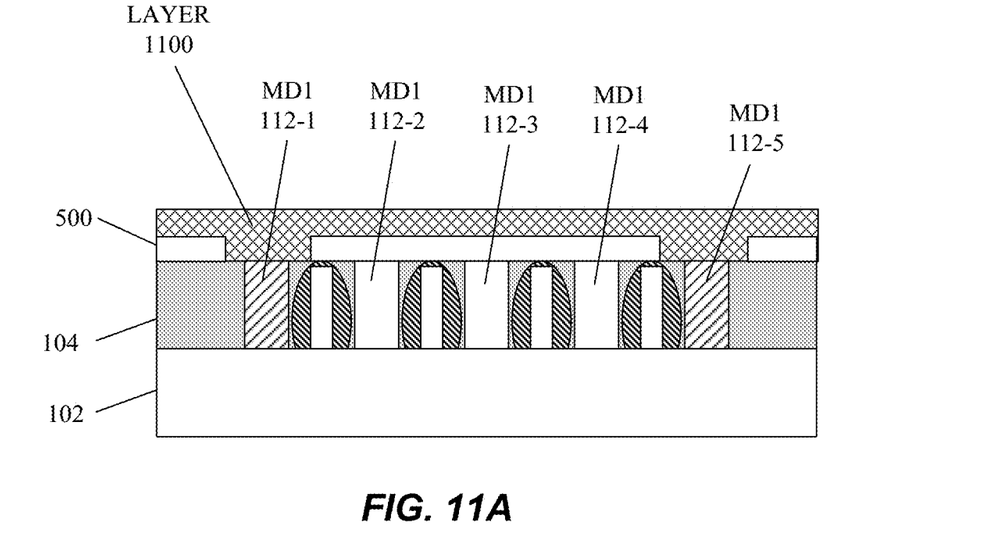
FIGS. 11A and 11B illustrate side and top views, respectively, of the integrated circuit of FIGS. 10A and 10B, including middle of line interconnects according to an aspect of the present disclosure.
Figure 11B:
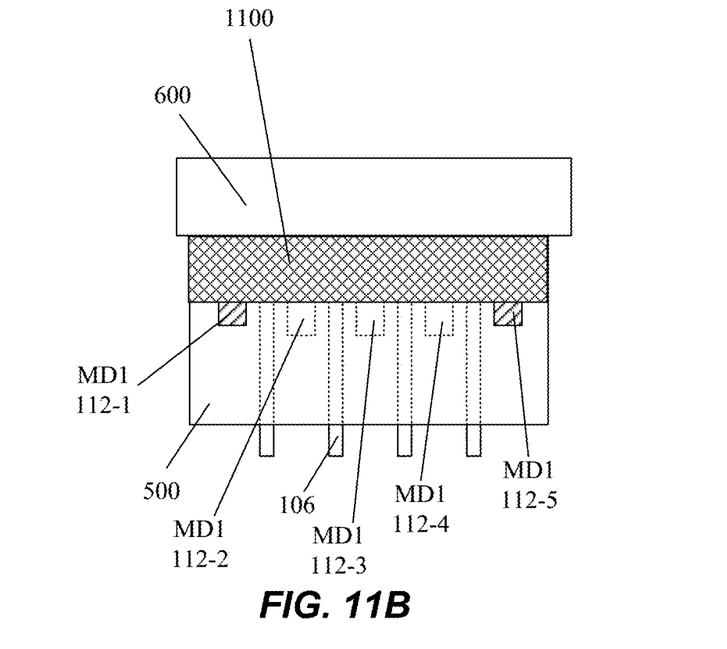

FIGS. 11A and 11B illustrate side and top views, respectively, of the integrated circuit of FIGS. 10A and 10B, including middle of line interconnects according to an aspect of the present disclosure. In FIG. 11A the side view illustrate deposition of a layer 1100 that couples only the active contacts MD1 112-1 and MD1 112-5. The layer 1100 may be a middle of line layer, such as the M0 layer (e.g., MD2). In this arrangement, the layer 1100 does not contact, at least in an electrical sense, the active contacts MD1 112-2, MD1 112-3 and MD1 112-4 and the poly gates 106. In the top view of FIG. 11B, the layer 1100 may be over or under, or alongside the active area of the IC device 100 depending on the orientation of the devices on the substrate 102, an active region or area of the IC device 100.

In this configuration, the layer 1100 does not contact the active contacts MD1 112-2, MD1 112-3 and MD1 112-4 that are proximate the active area of the IC device 100 because the hard mask 500 insulates the layer 1100 from the active contacts MD1 112-2, MD1 112-3 and MD1 112-4 and the poly gates 106 that are proximate (over, under, or alongside) the active area or region of the active devices of the IC device 100 on the substrate 102.

The thickness of the hard mask 500 is selected to allow conformal deposition of the layer 1100 onto the exposed ones of the active contacts 112. The thickness of the hard mask 500 may be, for example, in the range of fifty (50) to two-hundred (200) angstroms (A). The layer 1100 may be polished or further patterned, through wet etching, mechanical etching, or chemical mechanical polishing (CMP), or other processes.

Figure 12A:
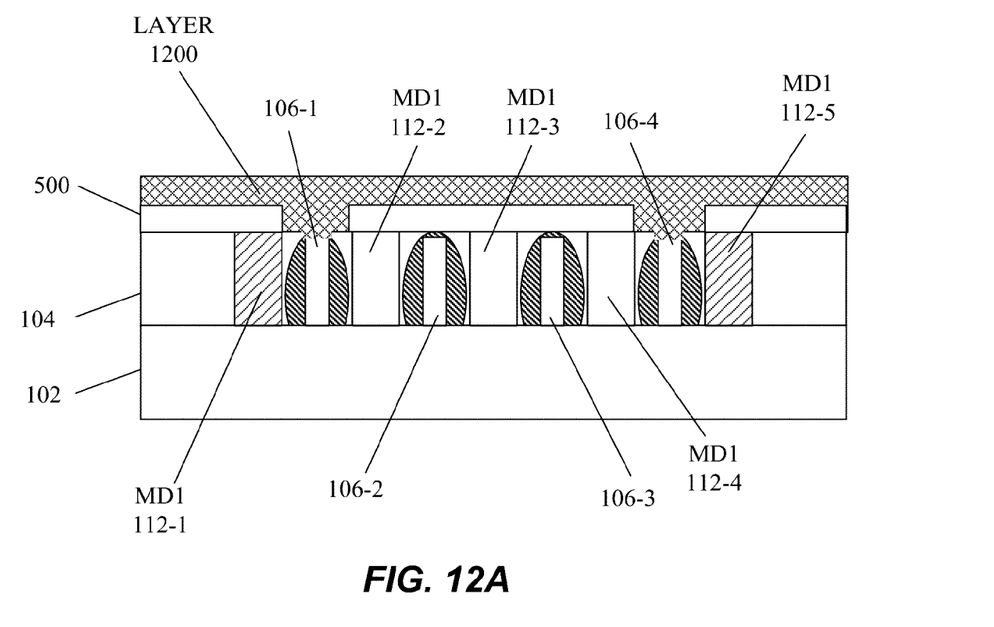
FIGS. 12A and 12B side and top views, respectively, of an integrated including middle of line interconnects according to an aspect of the present disclosure.
Figure 12B:
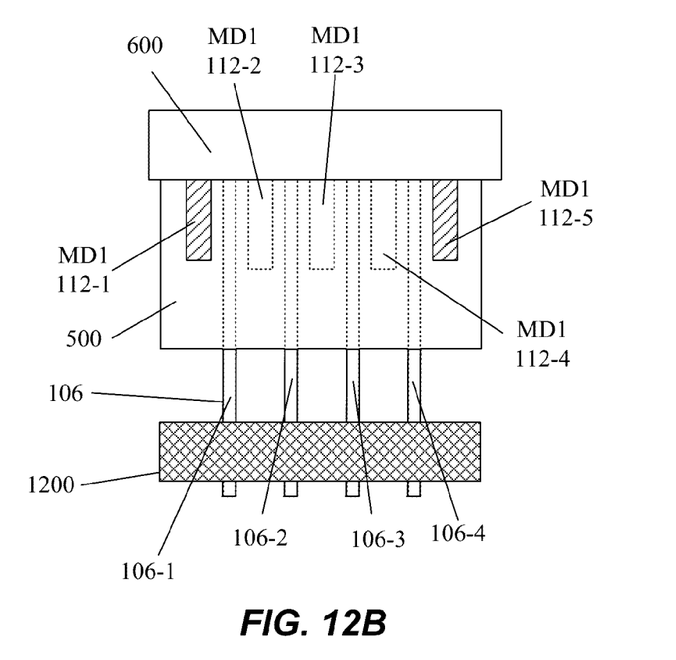

In another aspect of the present disclosure, non-adjacent poly gates can be coupled together in a manner similar to that described above with respect to non-adjacent active contacts. That is, some of the poly gates are isolated from the coupling. FIGS. 12A and 12B show side and top views, respectively, of an integrated circuit including middle of line interconnects according to this aspect of the present disclosure. FIG. 12A illustrates deposition of a layer 1200 that couples only the poly gate 106-1 and the poly gate 106-4 of the active devices of the IC device 100. The layer 1200 may be a middle of line layer, such as the M0 layer (e.g., MP). As shown in FIG. 12B, the layer 1200 does not contact, at least in an electrical sense, the poly gates 106-2 and 106-3. In this aspect of the disclosure, the process shown in FIGS. 5A to 11B is adjusted to isolate the poly gates 106-2 and 106-3 using the hard mask 500. As a result, the layer 1200 couples the poly gate 106-1 and the poly gate 106-4, but does not contact the poly gates 106-2 and 106-3 because the hard mask 500 insulates the poly gates 106-2 and 106-3 from the layer 1200.

Figure 13:
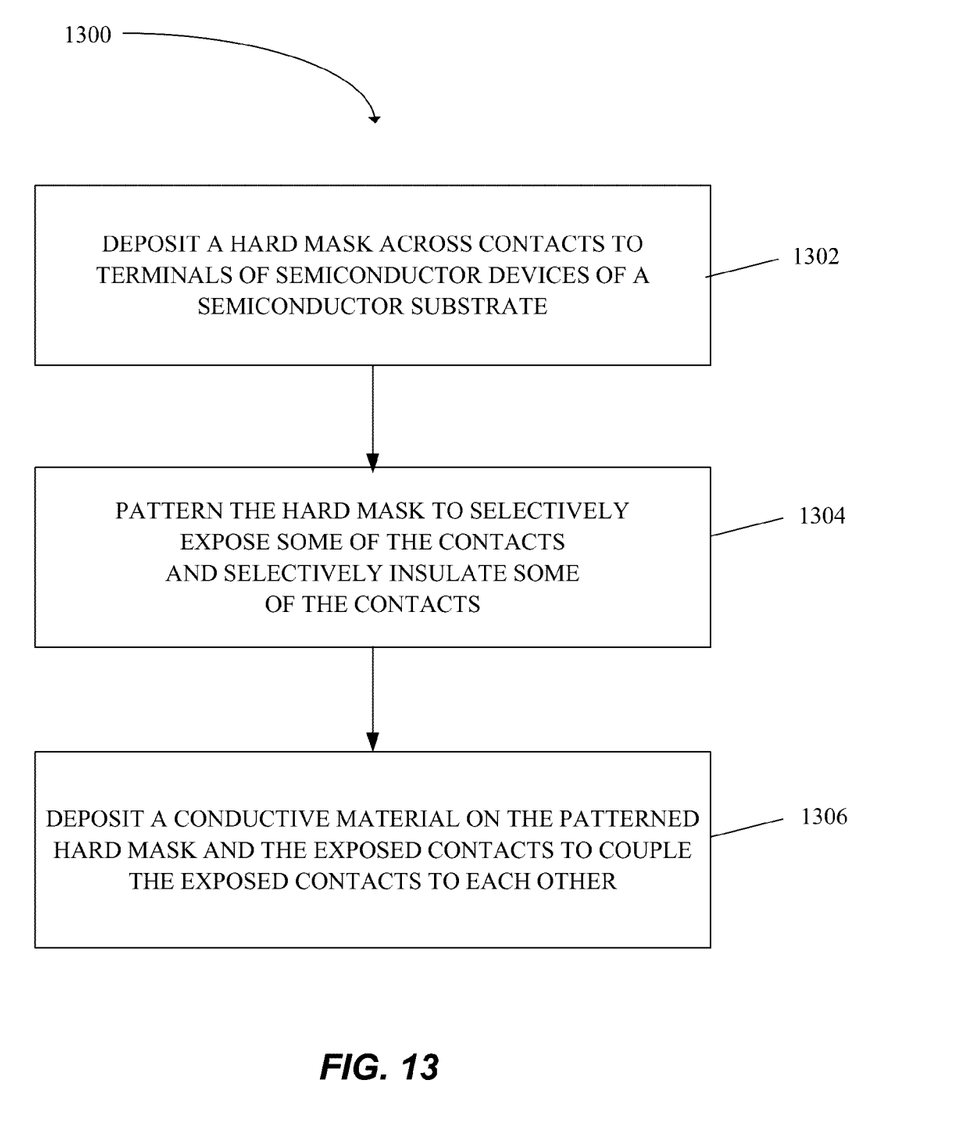
FIG. 13 is a process flow diagram illustrating a process of routing conductive layers within middle of line layers of an integrated circuit according to an aspect of the present disclosure.

FIG. 13 is a process flow diagram illustrating a method 1300 for fabricating middle of line (MOL) layers according to an aspect of the present disclosure. In block 1302, a hard mask is deposited across contacts to terminals of semiconductor devices of a semiconductor substrate. For example, in FIG. 5A, a hard mask 500 is deposited on a surface of the integrated circuit opposite to the substrate 102 In block 1304, the hard mask is patterned to selectively expose some of the contacts and selectively insulate some of the contacts. For example, FIG. 9B illustrates exposure of the active contacts MD1 112-1 and MD1 112-5 by the etching of the hard mask 500, as shown by the solid lines.

Referring again to FIG. 13, in block 1306, a conductive material is deposited on the patterned hard mask and the exposed contacts to couple the exposed contacts to each other. For example, FIG. 11A illustrate deposition of a layer 1100 that couples only the active contacts MD1 112-1 and MD1 112-5. The layer 1100 may be a middle of line layer, such as the M0 layer (e.g., MD2). In another example, FIG. 12A illustrates deposition of a layer 1200 that couples only the poly gate 106-1 and the poly gate 106-4 of the active devices of the IC device 100. The layer 1200 may be a middle of line layer, such as the middle of line interconnect layer for connecting M1 to the poly gates of an integrated circuit (MP).

According to a further aspect of the present disclosure, a device including middle-of-line (MOL) layers is described. In one configuration, the device includes means for selectively exposing some active contacts to terminals of semiconductor devices of a semiconductor substrate and for selectively insulating some of the active contacts. The exposing means may be the hard mask 500 that covers the active contacts MD1 112-2, MD1 112-3 and MD1 112-4 as well as the poly gates 106. The active contacts MD1 112-1 and MD1 112-5 are exposed through openings in the hard mask 500, as shown in FIGS. 10A and 10B. The device also includes means for coupling the exposed active contacts to couple the exposed active contacts to each other. The coupling means may be layer 1100 that couples only the active contacts MD1 112-1 and MD1 112-5. The layer 1100 may be a middle of line layer, such as the M0 layer (e.g., MD2), as shown in FIGS. 11A and 11B. In another aspect, the aforementioned means may be any layer, any interface or structure configured to perform the functions recited by the aforementioned means.

Figure 14:
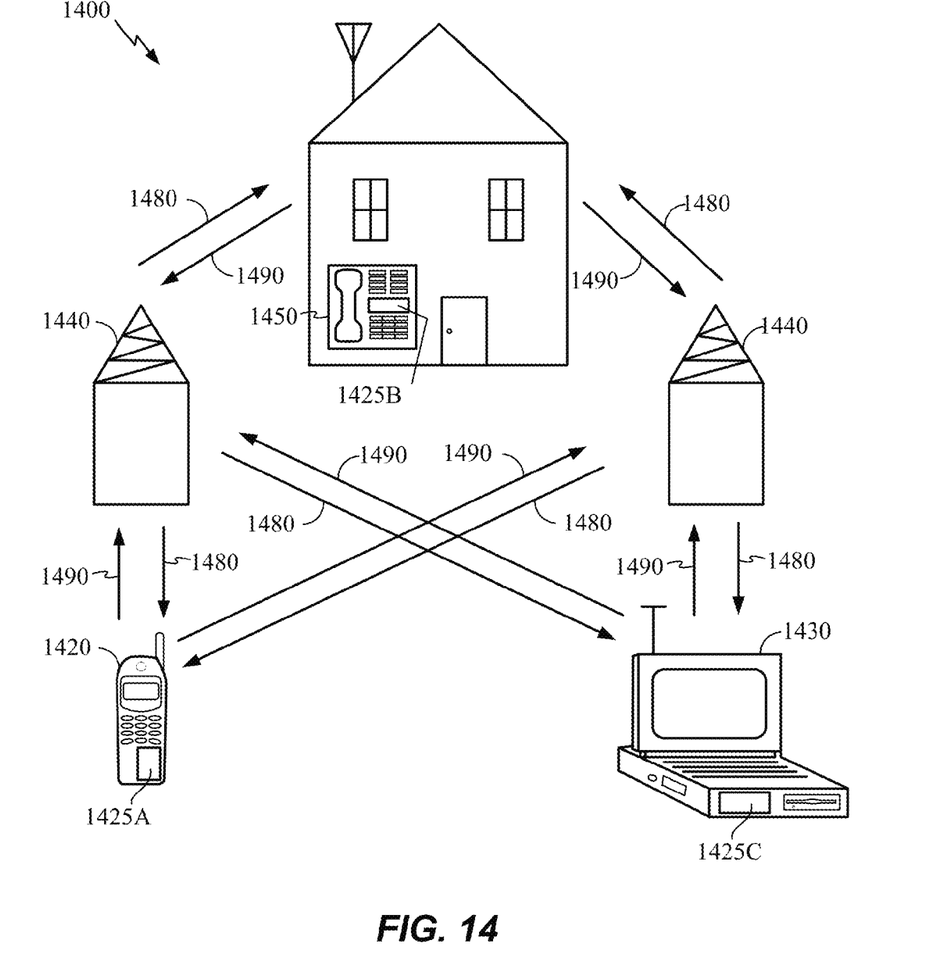
FIG. 14 is a block diagram showing an exemplary wireless communication system in which a configuration of the disclosure may be advantageously employed.

FIG. 14 is a block diagram showing an exemplary wireless communication system 1400 in which an aspect of the disclosure may be advantageously employed. For purposes of illustration, FIG. 14 shows three remote units 1420, 1430, and 1450 and two base stations 1440. It will be recognized that wireless communication systems may have many more remote units and base stations. Remote units 1420, 1430, and 1450 include IC devices 1425A, 1425C, and 1425B that include the disclosed devices. It will be recognized that other devices may also include the disclosed devices, such as the base stations, switching devices, and network equipment. FIG. 14 shows forward link signals 1480 from the base station 1440 to the remote units 1420, 1430, and 1450 and reverse link signals 1490 from the remote units 1420, 1430, and 1450 to base stations 1440.

In FIG. 14, remote unit 1420 is shown as a mobile telephone, remote unit 1430 is shown as a portable computer, and remote unit 1450 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 14 illustrates remote units according to the aspects of the disclosure, the disclosure is not limited to these exemplary illustrated units. Aspects of the disclosure may be suitably employed in many devices, which include the disclosed devices.

Figure 15:
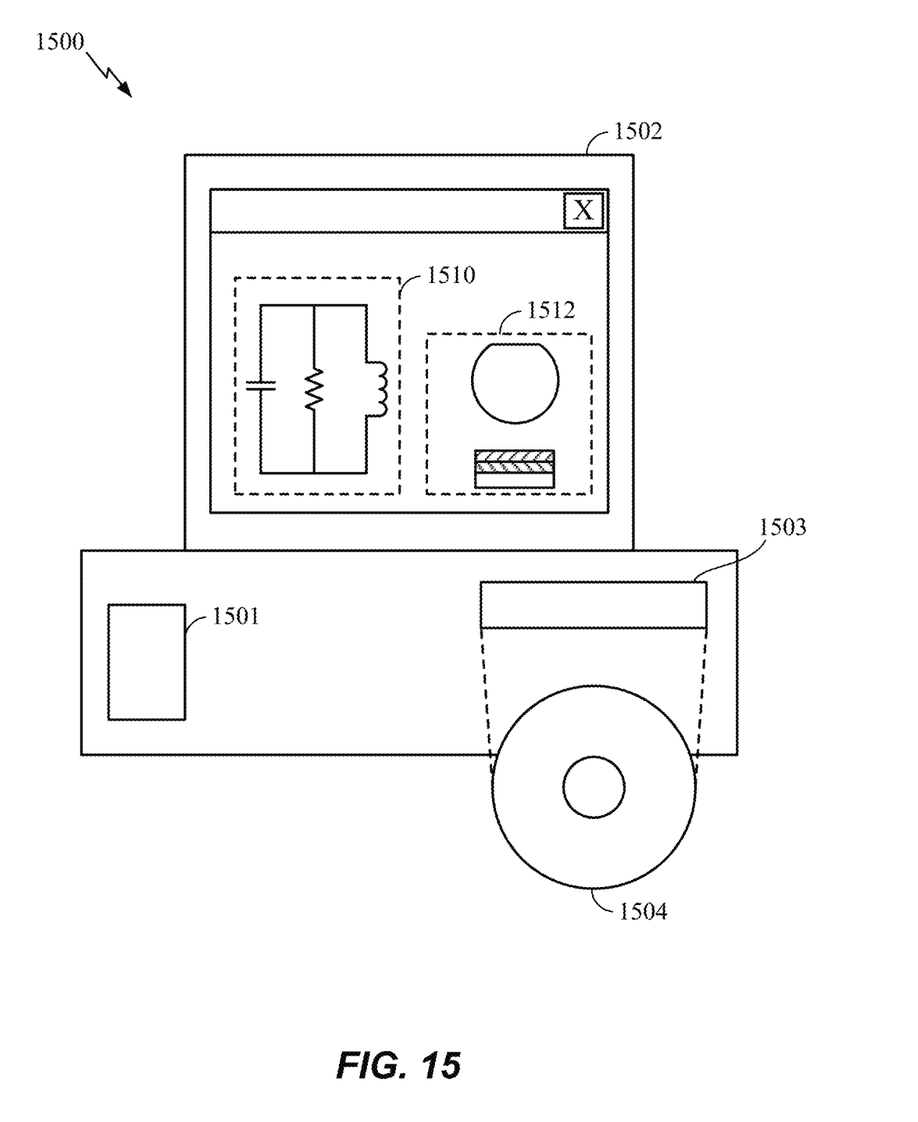
FIG. 15 is a block diagram illustrating a design workstation used for circuit, layout, and logic design of a semiconductor component according to one configuration.

FIG. 15 is a block diagram illustrating a design workstation used for circuit, layout, and logic design of a semiconductor component, such as the devices disclosed above. A design workstation 1500 includes a hard disk 1501 containing operating system software, support files, and design software such as Cadence or OrCAD. The design workstation 1500 also includes a display 1502 to facilitate design of a circuit 1510 or a semiconductor component 1512 such as a device in accordance with an aspect of the present disclosure. A storage medium 1504 is provided for tangibly storing the design of the circuit 1510 or the semiconductor component 1512. The design of the circuit 1510 or the semiconductor component 1512 may be stored on the storage medium 1504 in a file format such as GDSII or GERBER. The storage medium 1504 may be a CD-ROM, DVD, hard disk, flash memory, or other appropriate device. Furthermore, the design workstation 1500 includes a drive apparatus 1503 for accepting input from or writing output to the storage medium 1504.

Data recorded on the storage medium 1504 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1504 facilitates the design of the circuit 1510 or the semiconductor component 1512 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A device including middle-of-line (MOL) layers, the MOL layers comprising:
    an isolation layer comprising a plurality of active contacts of a first type and a plurality of active contacts of a second type;
    a patterned hard mask layer arranged on the isolation layer to selectively expose the plurality of active contacts of the first type to terminals of semiconductor devices of a semiconductor substrate, wherein the patterned hard mask layer selectively insulates the plurality of active contacts of the second type; and
    a conductive material directly contacting the patterned hard mask layer and directly contacting the exposed plurality of active contacts of the first type, the conductive material arranged to couple the exposed plurality of active contacts of the first type to each other over an active area of the semiconductor devices.

2. The device of claim 1, in which a thickness of the patterned hard mask layer allows the conductive material to be conformally deposited on the exposed plurality of active contacts of the first type.

3. The device of claim 1, in which the conductive material is tungsten or copper.

4. The device of claim 1, in which the exposed plurality of active contacts of the first type comprises source contacts, drain contacts, or gate contacts.

5. The device of claim 1, in which the exposed plurality of active contacts of the first type comprises metal contacts or polysilicon contacts.

6. The device of claim 1, in which an insulated active contact of the second type and an exposed active contact of the first type are adjacent to each other.

7. The device of claim 1, in which the patterned hard mask layer creates rectangular openings to selectively expose the plurality of active contacts of the first type.

8. The device of claim 1, in which the conductive material directly contacting the exposed plurality of active contacts of the first type extends across unexposed ones of the plurality of active contacts of the second type.

9. The device of claim 1 integrated into a mobile phone, a set top box, a music player, a video player, an entertainment unit, a navigation device, a computer, a hand-held personal communication systems (PCS) unit, a portable data unit, and/or a fixed location data unit.

10. A device including middle-of-line (MOL) layers, the MOL layers comprising:
- an isolation layer comprising a plurality of active contacts of a first type and a plurality of active contacts of a second type;
- means for selectively exposing the plurality of active contacts of the first type to terminals of semiconductor devices of a semiconductor substrate and for selectively insulating the plurality of active contacts of the second type; and
- means for directly contacting the exposed plurality of active contacts of the first type to couple the exposed plurality of active contacts of the first type to each other.

11. The device of claim 10, in which the directly contacting means extends across unexposed ones of the plurality of active contacts of the second type.

12. The device of claim 10, in which a thickness of the exposing means allows the directly contacting means to be conformally deposited on the exposed plurality of active contacts of the first type.

13. The device of claim 10, in which the exposed plurality of active contacts of the first type comprises source contacts, drain contacts, or gate contacts.

14. The device of claim 10, in which the exposed plurality of active contacts of the first type comprises metal contacts or polysilicon contacts.

15. The device of claim 10, in which an insulated active contact of the second type and an exposed active contact of the first type are adjacent to each other.

16. The device of claim 10, integrated into a mobile phone, a set top box, a music player, a video player, an entertainment unit, a navigation device, a computer, a hand-held personal communication systems (PCS) unit, a portable data unit, and/or a fixed location data unit.

* * * * *